United States Patent
Shibata et al.

(10) Patent No.: US 7,247,884 B2
(45) Date of Patent: Jul. 24, 2007

(54) GROUP III NITRIDE COMPOUND SEMICONDUCTOR LIGHT-EMITTING ELEMENT

(75) Inventors: Naoki Shibata, Nishikasugai-gun (JP); Takahiro Kozawa, Aichi-gun (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 0 days.

(21) Appl. No.: 10/164,309

(22) Filed: Jun. 7, 2002

(65) Prior Publication Data

US 2003/0006430 A1    Jan. 9, 2003

(30) Foreign Application Priority Data

Jun. 8, 2001    (JP)    ............... P2001-174912

(51) Int. Cl.
*H01L 27/15*    (2006.01)
*H01L 33/00*    (2006.01)

(52) U.S. Cl. ........................ 257/79; 257/103
(58) Field of Classification Search ................ 257/79, 257/88, 94, 99, 96, 103, 101, 89, 13, 98
See application file for complete search history.

(56) References Cited

U.S. PATENT DOCUMENTS

| | | | |
|---|---|---|---|
| 5,644,190 A | * | 7/1997 | Potter .......................... 313/336 |
| 5,777,350 A | | 7/1998 | Nakamura et al. |
| 5,945,689 A | * | 8/1999 | Koike et al. ................... 257/88 |
| 6,288,416 B1 | * | 9/2001 | Koike et al. ................... 257/94 |
| 6,337,035 B1 | * | 1/2002 | Itoh et al. ............. 252/301.4 R |
| 6,576,933 B2 | * | 6/2003 | Sugawara et al. .......... 257/103 |
| 6,998,690 B2 | * | 2/2006 | Nakamura et al. .......... 257/431 |

FOREIGN PATENT DOCUMENTS

| | | |
|---|---|---|
| JP | 08-167737 | 6/1996 |
| JP | 10-012916 | 1/1998 |
| JP | 10-022525 | 1/1998 |
| JP | 10-022527 | 1/1998 |

* cited by examiner

*Primary Examiner*—Howard Weiss
*Assistant Examiner*—(Vikki) Hoa B. Trinh
(74) *Attorney, Agent, or Firm*—McGinn IP Law Group PLLc

(57) ABSTRACT

A photo-excited semiconductor layer smaller in band gap energy than a light-emitting layer made of a Group III nitride compound semiconductor is provided between a substrate and the light-emitting layer. The photo-excited semiconductor layer is excited by the light emitted from the light-emitting layer to thereby emit light at a wavelength longer than that of the light emitted from the light-emitting layer.

33 Claims, 3 Drawing Sheets

GROUP III NITRIDE COMPOUND SEMICONDUCTOR LIGHT-EMITTING ELEMENT

The present application is based on Japanese Patent Application No. 2001-174912, which is incorporated herein by reference.

BACKGROUND OF THE INVENTION

1. Field of the Invention

The present invention relates to a Group III nitride compound semiconductor light-emitting element and particularly to a Group III nitride compound semiconductor light-emitting element in which the wavelength of light emitted from a light-emitting layer is converted so that light in a color different from the color of the light emitted from the light-emitting layer can be emitted. The light-emitting element according to the invention can be used, for example, for a polychromatic light source or a white light source.

2. Description of the Related Art

There is known a light-emitting element or a light-emitting device (LED) of the type which uses a Group III nitride compound semiconductor light-emitting element and a fluorescent substance in combination so that the fluorescent substance can convert the wavelength of a part of light emitted from a light-emitting layer contained in the light-emitting element to thereby emit light in a color different from the original color of light emitted from the light-emitting element. For example, an LED of the type has been already put into practical use. In the LED of this type, a Group III nitride compound semiconductor light-emitting element for emitting blue light, and a fluorescent substance for emitting yellow light when excited by the blue light are used in combination so that white light can be emitted. The LED of this type is generally formed so that the light-release side of the Group III nitride compound semiconductor light-emitting element is coated with a light-transmissive resin containing a fluorescent substance.

To produce the related-art LED, it was necessary to first produce a light-emitting element, and then coat the light-emitting element with a fluorescent substance-containing resin. That is, the production process was troublesome and complex, and the production cost was high.

Moreover, because the light-emitting element was coated with the fluorescent substance-containing resin generally by means of application, dipping or the like, it was not easy to control the thickness of the resin accurately. For this reason, the amount of the fluorescent substance to be added varied easily, so that it was not easy to produce the LED with uniform quality (emission color, emission intensity, and so on).

Moreover, because the fluorescent substance was disposed in a position far from a light-emitting portion (light-emitting layer) in the light-emitting element, and because a part of light emitted from the light-emitting element was consumed wastefully as a loss in the interface of the fluorescent substance-containing resin, light could not be always emitted with high efficiency from the fluorescent substance. For this reason, the light-emitting efficiency of the LED was low.

SUMMARY OF THE INVENTION

In consideration of the problems, an object of the invention is to provide a Group III nitride compound semiconductor light-emitting element in which the wavelength of a part of light emitted from a light-emitting layer is converted so that the light-emitting element can emit light in a color different from the color of the light emitted from the light-emitting layer and which is low in production cost and free from variation in quality and has a novel structure for emitting light with high efficiency.

To achieve the foregoing object, the invention is configured as follows.

A Group III nitride compound semiconductor light-emitting element including:

a substrate;

a light-emitting layer made of a Group III nitride compound semiconductor; and at least one photo-excited semiconductor layer made of a Group III nitride compound semiconductor and excited by light emitted from the light-emitting layer to thereby emit light at a wavelength longer than that of the light emitted from the light-emitting layer.

In this configuration, the photo-excited semiconductor layer is provided as one of semiconductor layers constituting the Group III nitride compound semiconductor light-emitting element, so that the wavelength of a part of light emitted from the light-emitting layer is converted by the photo-excited semiconductor layer. Hence, the step of coating the light-emitting element with a fluorescent substance-containing resin after production of the light-emitting element in the related-art configuration can be eliminated, so that a light-emitting element or a light-emitting device can be produced inexpensively with little variation in quality. Moreover, because the photo-excited semiconductor layer is included in the light-emitting element, the photo-excited semiconductor layer can be disposed near to the light-emitting layer. Thus, the photo-excited semiconductor layer can be efficiently irradiated with light emitted from the light-emitting layer, so that light can be emitted from the photo-excited semiconductor layer. Accordingly, a light-emitting element with high light-emitting efficiency can be provided. Moreover, because the light-emitting element can be produced without the necessity to coat the light-emitting element with a fluorescent substance-containing resin, that is, because the light-emitting element can be used as a so-called bare chip, the light-emitting element can be applied to various mounting methods. Hence, there is an advantage in that the degree of freedom for designing products is high.

Features and advantages of the invention will be evident from the following detailed description of the preferred embodiments described in conjunction with the attached drawings.

DETAILED DESCRIPTION OF THE PREFERRED EMBODIMENTS

Respective constituent members of a Group III nitride compound semiconductor light-emitting element according to the invention will be described below in detail.

The Group III nitride compound semiconductor light-emitting element according to the invention has a substrate, a light-emitting layer, and at least one photo-excited semiconductor layer. Incidentally, a homostructure or a single or double heterostructure can be used as the structure of the light-emitting element. The light-emitting layer may contain a quantum well structure. Further, each of the layers can be formed by a known method such as a metal organic chemical vapor deposition method (MOCVD method), a molecular beam epitaxy method (MBE method), a halide vapor phase epitaxy method (HVPE method), a sputtering method, or an ion-plating method.

The material of the substrate is not particularly limited if Group III nitride compound semiconductor layers can be grown on the material. Examples of the material of the substrate which can be used include sapphire, spinel, silicon, silicon carbide, zinc oxide, gallium phosphide, gallium arsenide, magnesium oxide, manganese oxide, and Group III nitride compound semiconductor monocrystal.

The light-emitting layer is made of a Group III nitride compound semiconductor. Here, the Group III nitride compound semiconductor is expressed as quarternary compounds represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$). The group III elements may be partially replaced by boron (B), thallium (Tl), etc. Further, the nitrogen (N) may be partially replaced by phosphorus (P), arsenic (As), antimony (Sb), bismuth (Bi), etc. The Group III nitride compound semiconductor layer may contain any optional dopant. Si, Ge, Se, Te, C, etc. may be used as n-type impurities. Mg, Zn, Be, Ca, Sr, Ba, etc. may be used as p-type impurities.

The wavelength of light emitted from the light-emitting layer is not particularly limited. For example, a light-emitting layer emitting light exhibiting a peak emission wavelength in a wavelength range of from 400 nm to 560 nm can be used. Preferably, a light-emitting layer emitting light exhibiting a peak emission wavelength in a wavelength range of from 450nm to 490 nm may be used. Apart of the light emitted from the light-emitting layer is used for exciting the photo-excited semiconductor layer which will be described later. As a result, the other part of light which has not been used as excitation light in the light emitted from the light-emitting layer is mixed with light emitted from the fluorescent layer (photo-excited semiconductor layer) in terms of the color of light, so that the mixed light is radiated out. Hence, the light-emitting element can be obtained as a light-emitting element emitting light in various color tones based on the color mixing of light.

It is possible to use a light-emitting layer emitting light in an ultraviolet region exhibiting a peak emission wavelength in a wavelength range of from 300 nm to 400 nm in the light-emitting layer. Preferably, a light-emitting layer emitting light exhibiting a peak emission wavelength in a wavelength range of from 340 nm to 400 nm may be used. Because the photo-excited semiconductor layer can be excited by the light in the ultraviolet region having high energy to thereby emit light with higher efficiency, high-luminance emission can be obtained from the photo-excited semiconductor layer. When a fluorescent substance is contained in the photo-excited semiconductor layer and/or when a layer containing a fluorescent substance is provided as will be described later, the fluorescent substance can be efficiently excited to emit light. When almost the whole part of the light in the ultraviolet region emitted from the light-emitting layer is used for exciting the photo-excited semiconductor layer (which will be described later) so that the photo-excited semiconductor layer emits light exhibiting a plurality of emission peaks at different wavelengths, or when a plurality of photo-excited semiconductor layers are provided for emitting light at different wavelengths respectively, light-emitting elements emitting light in various color tones can be obtained on the basis of the color mixing of light.

A structure of emitting at least two kinds of light exhibiting emission peaks at different wavelengths respectively may be used for the light-emitting layer. This structure can be achieved by the formation of a plurality of light-emitting layers different in band gap energy in the light-emitting element. Alternatively, a plurality of portions different in band gap energy may be formed in one light-emitting layer. According to this structure, a plurality of kinds of light in different colors (inclusive of light in an ultraviolet region) are emitted from the light-emitting layer, so that light-emitting elements emitting light in various color tones can be obtained on the basis of the color mixing of the light. A part of light emitted from the light-emitting layer is used for exciting the photo-excited semiconductor layer which will be described later. As a result, the rest part of light which has not been used as excitation light in the light emitted from the light-emitting layer is mixed with light emitted from the photo-excited semiconductor layer, so that the mixed light is radiated out. For example, a light-emitting layer emitting light exhibiting a peak emission wavelength in an ultraviolet region and emitting light exhibiting a peak emission wavelength in a visible region can be used. In this case, the photo-excited semiconductor layer can be excited by the light in the ultraviolet region to emit light with high efficiency, so that high-luminance emission can be obtained from the photo-excited semiconductor layer. Accordingly, light emitted from the photo-excited semiconductor layer and light in the visible region emitted from the light-emitting layer are mixed with each other in terms of the color of light to be thereby radiated out, so that the luminance (intensity) of light can be enhanced. An example of the light in the ultraviolet region emitted from the light-emitting layer is light exhibiting a peak emission wavelength in a wavelength range of not longer than 400 nm. That is, it is possible to use a light-emitting layer emitting light in an ultraviolet region exhibiting a peak emission wavelength in a wavelength range of not longer than 400 nm and emitting light in a visible region. If the light-emitting layer satisfies this condition, for example, a light-emitting layer exhibiting at least two peak emission wavelengths in an ultraviolet region or a light-emitting layer exhibiting at least two peak emission wavelengths in a visible region may be used. The light exhibiting a peak emission wave length in an ultra violet region is preferably the light that can excite the photo-excited semiconductor layer with high efficiency. Accordingly, it is preferable that the light exhibits an emission peak at a wavelength near to the excitation wavelength of the photo-excited semiconductor layer. It is further preferable that the light exhibits a single emission peak at a wavelength near to the excitation wavelength of the photo-excited semiconductor layer. For example, the light in the ultraviolet region can be provided as light exhibiting a peak emission wavelength in a wavelength range of from 300 nm to 410 nm.

Incidentally, when a fluorescent substance is contained in the photo-excited semiconductor layer and/or when a layer containing a fluorescent substance is provided, as will be described later, the light-emitting layer can be formed in consideration of the excitation wavelength and emission wavelength of the fluorescent substance. For example, a light-emitting layer that can make the fluorescent substance emit light with high efficiency may be used.

The light in the visible region emitted from the light-emitting layer is mixed with the light emitted from the photo-excited semiconductor layer (which will be described later), so that the mixed light is released. That is, an emission color obtained by mixing the light in the visible region emitted from the light-emitting layer of the light-emitting element with the light emitted from the fluorescent substance is obtained from the light-emitting element according to the invention. Accordingly, the color (wavelength) of the light in the visible region can be selected suitably in consideration of the color (wavelength) of light emitted from the photo-excited semiconductor layer and the color of light emitted from the light-emitting element as a whole. From another viewpoint, the color of light emitted from the light-emitting element can be changed when the color (wavelength) of the light in the visible region is changed.

Specifically, the light in the visible region can be selected to exhibit a peak emission wavelength in a wavelength range of from 430 nm to 560 nm. Preferably, the peak emission wavelength may be selected to be in a range of from 450 nm to 490 nm.

An example of the case where the light-emitting layer is made of quarternary compounds is as follows. The light-emitting layer is formed to have a portion of $Al_{x2}Ga_{1-x1-x2}In_{x2}N$ ($0<x1<1$, $0<x2<1$, $x1>x2$) and a portion of $Al_{y2}Ga_{1-y1-y2}In_{y1}N$ ($0<y1<1$, $0<y2<1$, $y1>y2$). The former portion is relatively large in band gap because it contains a large amount of Al in the composition. Hence, light in an ultraviolet region at a relatively short emission wavelength can be emitted from the former portion. On the other hand, the latter portion is relative small in band gap because it contains a large amount of In in the composition. Hence, light in a visible region at a long emission wavelength can be emitted from the latter portion. These two portions are preferably formed in a state of mixed crystal in a single layer. Such a light-emitting layer can be formed, for example, by an MOCVD method. Generally, in order to form a light-emitting layer of a Group III nitride compound semiconductor by an MOCVD method, an ammonia gas and Group III element alkyl compound gases such as trimethyl gallium (TMG), trimethyl aluminum (TMA) and trimethyl indium (TMI) are supplied into an MOCVD apparatus heated to a predetermined temperature so that a thermal decomposition reaction is performed. The growth conditions for the light-emitting layer, that is, the growth temperature, the flow rate of the ammonia gas, the mixture ratio and flow rate of the alkyl compound gases, the ratio of the flow rate of the ammonia gas to the flow rate of the alkyl compound gases, the growth rate, and so on, can be adjusted to form a light-emitting layer of mixed crystal of the materials.

According to the inventors' examination, a light-emitting layer made of mixed crystal of $Al_{x1}Ga_{1-x1-x2}In_{x2}N$ ($0<x1<1$, $0<x2<1$, $x1>x2$) and $Al_{y2}Ga_{1-y1-y2}In_{y1}N$ ($0<y1<1$, $0<y2<1$, $y1>y2$) can be grown with good crystallinity when the mixture ratio TMG:TMA:TMI of supplied raw material gases is from 1:0.01:0.05 to 1:0.5:10, the ratio of the ammonia gas to the Group III raw material gases (TMG, TMA, TMI) is from 1000:1 to 100000:1, the growth temperature is from 600° C. to 1100° C., and the growth rate is from 0.002 to 1 μm/min. Preferably, the ratio TMG:TMA:/TMI is from 1:0.02:0.4 to 1:0.2:2, the ratio of the ammonia gas to the Group III element raw material gases (TMG, TMA, TMI) is from 5000:1 to 80000:1, the growth temperature is from 700° C. to 900° C., and the growth rate is from 0.01 to 0.1 μm/min.

Incidentally, when the growth conditions for the light-emitting layer are adjusted suitably, the light-emitting layer can be formed as a light-emitting layer different in the ratio of the portion of $Al_{x1}Ga_{1-x1-x2}In_{x2}N$ ($0<x1<1$, $0<x2<1$, $x1>x2$) to the portion of $Al_{y2}Ga_{1-y1-y2}In_{y1}N$ ($0<y1<1$, $0<y2<1$, $y1>y2$).

The photo-excited semiconductor layer is constituted by a Group III nitride compound semiconductor layer. This layer is excited by light emitted from the light-emitting layer and emits light at a wavelength longer than the wavelength of the light emitted from the light-emitting layer. For example, a Group III nitride compound semiconductor doped with impurities can be used as the photo-excited semiconductor layer. One member selected from the group consisting of Si, S, Se, Te, Ge, C, O, Zn, Mg, B and Tl may be used as the impurities for doping the photo-excited semiconductor layer, or a plurality of members selected from this group may be used as the impurities. Preferably, at least one member selected from the group consisting of Si, S, Se, Te, Ge, C and O may be used as the impurities (dopant).

According to the inventors' examination, when the dope amount of the impurities in the photo-excited semiconductor layer is selected to be in a range of from $1\times10^{16}/cm^3$ to $5\times10^{21}/cm^3$, preferably in a range of from $1\times10^{18}/cm^3$ to $5\times10^{20}/cm^3$, the impurities form a high-density impurity level in a band gap of the Group III nitride compound semiconductor constituting the photo-excited semiconductor layer. A part of light emitted from the light-emitting layer is absorbed and recombined through the band gap of the photo-excited semiconductor layer and/or the impurity level so that the wavelength of the part of light is converted. As a result, the light becomes light at a wavelength longer than that of the light emitted from the light-emitting layer so as to be radiated from the photo-excited semiconductor layer. On this occasion, the amount (content) of the impurities to be added can be adjusted suitably in accordance with the quantity of light emitted from the fluorescent substance. It is further preferable that the amount of the impurities to be added has no influence on the crystallinity of the photo-excited semiconductor layer. Incidentally, when the selection of the impurities is to be performed, the color of light radiated out from the light-emitting element is taken into consideration. In other words, impurities are selected suitably so that light of a desired color can be obtained.

The photo-excited semiconductor layer may be made of $In_xAl_yGa_{1-x-y}N$ ($0\leq x\leq 1$, $0\leq y\leq 1$, $0\leq x+y\leq 1$, $y\leq x$) doped with n-type impurities. Preferably, the photo-excited semiconductor layer is made of a Group III nitride compound semiconductor smaller in band gap than the semiconductor constituting the light-emitting layer. For example, the photo-excited semiconductor layer is formed to have band gap energy of from 1.9 to 3.4 eV. Preferably, the photo-excited semiconductor layer is formed to have band gap energy of from 2.0 to 2.8 eV. An example of the photo-excited semiconductor layer is a layer made of $In_aGa_{1-a}N$ ($0\leq a<1$) doped with n-type impurities. Such a photo-excited semiconductor layer emits light in a yellow or red region when excited by light in a blue or ultraviolet region. However, when the wavelength of light emitted from the light-emitting layer is converted through the impurity level so that light of a desired color is obtained, it is a matter of course that the band gap energy of the photo-excited semiconductor layer may be wider than that of the light-emitting layer.

A plurality of photo-excited semiconductor layers may be provided. In this case, all the photo-excited semiconductor layers may be formed as one composition or a part of the photo-excited semiconductor layers may be different in composition from the other part of the photo-excited semiconductor layers. Further, the kind of the impurities as a dopant and the dope amount of the impurities in a part of the photo-excited semiconductor layers may be changed. The wavelength of light emitted from each photo-excited semiconductor layer excited by the light emitted from the light-emitting layer is determined on the basis of the composition of the photo-excited semiconductor layer and/or the kind of the impurities as a dopant and the dope amount of the impurities. That is, a plurality of kinds of light at different wavelengths are obtained from light-emitting layers different in composition, respectively. Accordingly, when a plurality of kinds of photo-excited semiconductor layers different in composition and/or the kind of impurities as a dopant and the dope amount of the impurities are provided, a plurality of kinds of light at different wavelengths are emitted from the photo-excited semiconductor layers respectively. On this occasion, the color of light emitted from the light-emitting element as a whole can be changed or corrected.

Further, the photo-excited semiconductor layer may be formed as a structure in which a plurality of layers different in composition are laminated. When, for example, photo-excited semiconductor layers different in composition are laminated alternately so that the thickness $d$ of the photo-excited semiconductor layer is selected to be substantially equal to $m\lambda/2n$ (in which $m$ is a natural number) in which $\lambda$ is a peak emission wavelength in the light-emitting layer and $n$ is a refractive index in the photo-excited semiconductor layer, light emitted from the light-emitting layer is repeatedly reflected in the photo-excited semiconductor layer by an interference effect. As a result, the wavelength converting efficiency in the photo-excited semiconductor layer is improved so that high-luminance emission can be obtained from the photo-excited semiconductor layer. At the same time, light moving toward the substrate 11 side is reflected by the photo-excited semiconductor layer. As a result, the efficiency of extracting light in a direction opposite to the photo-excited semiconductor layer viewed from the light-emitting layer is improved so that improvement in light-emitting efficiency can be attained when this direction is used as a light-extracting direction. In this case, the light-emitting layer and the photo-excited semiconductor layer are near to each other, so that the light-extracting efficiency can be improved more greatly than that in a method in which a reflecting mirror is provided on a surface (rear surface) of the substrate where the semiconductor layers are not formed, or outside of the light-emitting element.

The position where the photo-excited semiconductor layer is formed is not particularly limited. For example, the photo-excited semiconductor layer may be formed between the substrate and the light-emitting layer or above the light-emitting layer viewed from the substrate. When the substrate is made of a light-transmissive material, the photo-excited semiconductor layer may be formed on a side opposite to the side where the light-emitting layer is formed, viewed from the substrate.

The photo-excited semiconductor layer may be provided to abut on the substrate or the light-emitting layer. Alternatively, a group III nitride compound semiconductor layer maybe interposed between the photo-excited semiconductor layer and the substrate or light-emitting layer. In this case, the Group III nitride compound semiconductor layer may be provided as a multi-layer constituted by a plurality of layers.

When a plurality of photo-excited semiconductor layers are provided, each of the photo-excited semiconductor layers may be formed in any one of the positions. For example, two photo-excited semiconductor layers may be provided between the substrate and the light-emitting layer. Alternatively, two photo-excited semiconductor layers may be provided so that the light-emitting layer is sandwiched between the two photo-excited semiconductor layers. Alternatively, two photo-excited semiconductor layers may be provided so that the substrate is sandwiched between the two photo-excited semiconductor layers.

The photo-excited semiconductor layer may contain a fluorescent substance. A substance which emits light when excited by light emitted from the light-emitting layer is used as the fluorescent substance. In such a configuration, because the fluorescent substance emits light when excited by light emitted from the light-emitting layer, the color of light emitted from the light-emitting element as a whole can be changed or corrected. Here, the fluorescent substance is not limited on kind if it can emit light when excited by light emitted from the light-emitting layer. Examples of the fluorescent substance which can be used include rare-earth elements such as La (lanthanum), Ce (cerium), Pr (praseodymium), Nd (neodymium), Sm (samarium), Gd (gadolinium), Dy (dysprosium), Er (erbium), Eu (europium), Tb (terbium), Ho (holmium), Tm (thulium), Yb (ytterbium), and Lu (lutetium). Although it is a matter of course that these fluorescent substances can be used singly, two or more fluorescent substances selected optionally from these fluorescent substances may be used in combination. Preferably, Eu and/or Tb may be used as the fluorescent substance. Light emitted from these fluorescent substances exhibits a sharp line spectrum.

The amount (content) of the fluorescent substance to be added can be adjusted suitably in consideration of the quantity of light emitted from the fluorescent substance. It is preferable that the amount of the fluorescent substance to be added has no influence on the crystallinity of the photo-excited semiconductor layer. This is for the purpose of preventing lowering of the light-emitting element function. The fluorescent substance can be installed in a process of formation of the photo-excited semiconductor layer. When, for example, a Group III nitride compound semiconductor layer is to be formed by an MOCVD method, a fluorescent substance in addition to raw material gases (trimethyl gallium (TMG), trimethyl aluminum (TMA), trimethyl indium (TMI) and ammonia gas) for the semiconductor layer is supplied into an MOCVD apparatus and a crystalline structure is grown so that a photo-excited semiconductor layer doped with the fluorescent substance can be formed. Further, the method for forming a photo-excited semiconductor layer containing a fluorescent substance is not limited to the MOCVD method. Such a photo-excited semiconductor layer may be formed also by a known method such as a molecular beam epitaxy method (MBE method), a halide vapor phase epitaxy method (HVPE method), a sputtering method, or an ion-plating method.

Incidentally, when the fluorescent substance is to be selected, the color of light radiated out from the light-emitting element is taken into consideration. In other words, the fluorescent substance is selected suitably so that a desired emission color can be obtained.

A layer containing a fluorescent substance (hereinafter referred to "fluorescent substance layer") may be provided separately. When such a configuration is used, the same effect as in the case where the fluorescent substance is contained in the photo-excited semiconductor layer can be obtained. That is, light generated from the fluorescent substance excited by light emitted from the light-emitting layer can be used for changing or correcting the color of light emitted from the light-emitting element.

For example, a layer made of a light-transmissive resin containing a fluorescent substance is provided on the light-release surface side of the light-emitting element. Further, a Group III nitride compound semiconductor layer containing a fluorescent substance may be provided in the light-emitting element structure. The position where such a semiconductor layer is formed is not particularly limited. When, for example, a light-emitting element structure having an n-type Group III nitride compound semiconductor layer, a light-emitting layer, and a p-type Group III nitride compound semiconductor layer is used, the fluorescent substance may be contained in any layer selected from these layers or in a plurality of layers optionally selected from these layers. When a buffer layer of a Group III nitride compound semiconductor is used between the substrate and the n-type Group III nitride compound semiconductor layer, the fluorescent substance may be contained in the buffer layer. Further, a Group III nitride compound semiconductor layer containing a fluorescent substance maybe formed separately between two Group III nitride compound semiconductor layers optionally selected from these layers. Further, such a fluorescent substance may be contained in all the Group III nitride compound semiconductor layers.

When a large amount of the fluorescent substance needs to be added, it is preferable that the fluorescent substance is contained in a Group III nitride compound semiconductor layer large in thickness such as an n-contact layer. This is because a large amount of the fluorescent substance can be added while the influence on the crystallinity of the layer is suppressed when the layer is large in thickness. It is a matter of course that the fluorescent substance may be contained in a plurality of semiconductor layers so that a larger amount of the fluorescent substance can be added.

When the light-emitting layer in a multiple quantum well structure is used, the fluorescent substance can be contained in each barrier layer. This is because the fluorescent substance can be efficiently irradiated with light emitted from the quantum well layers.

Incidentally, the same material as described above for the photo-excited semiconductor layer can be used as the fluorescent substance.

According to the invention, light-emitting elements emitting light in various colors (at various wavelengths) as well as the white light can be formed. The light-emitting elements according to the invention can be used for forming light-emitting devices such as a round type LED and an SMD type LED. Such light-emitting devices can be used as light sources for various kinds of display devices such as a signal, a display board and a display unit.

For forming a light-emitting device, the light-emitting element according to the invention can be used further in combination with a fluorescent substance. A substance excited by any one of light emitted from the light-emitting layer in the light-emitting element, light emitted from the photo-excited semiconductor layer and light emitted from the fluorescent substance contained in the light-emitting layer (in the case where the photo-excited semiconductor layer contains the fluorescent substance or in the case where a layer containing the fluorescent substance is provided) can be used as the fluorescent substance. When such a fluorescent substance is used, the color of light radiated from the light-emitting device can be changed or corrected.

First Embodiment

The configuration of the invention will be described below more in detail in connection with embodiments of the invention.

Figure 1:
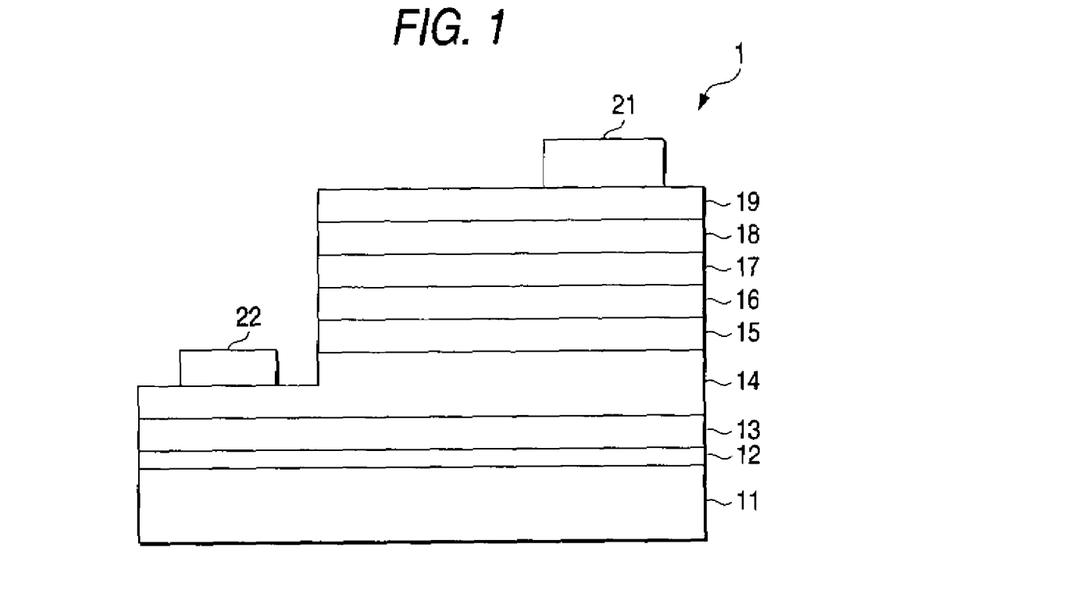
FIG. 1 is a view schematically showing the configuration of a light-emitting element as an embodiment of the invention.

FIG. 1 is a view schematically showing the configuration of a Group III nitride compound semiconductor light-emitting element 1 as an embodiment of the invention. Specifications of respective layers in the light-emitting element 1 are as follows.

| Layer | Composition: Dopant (Thickness) |
|---|---|
| Light-transmissive electrode 19 | Au (6 nm)/Co (1.5 nm) |
| Sixth layer 18 | p-AlGaN: Mg (0.05 µm) |
| Fifth layer 17 | p-AlGaN: Mg (0.03 µm) |
| Fourth layer 16 | Including an InGaN layer |
| Third layer 15 | n-AlGaN: Si (0.2 µm) |
| Second layer 14 | n-GaN: Si (1 µm) |
| First layer 13 | InGaN: Si, Se (3 µm) |
| Buffer layer 12 | AlN (10 nm) |
| Substrate 11 | Sapphire (300 µm) |

The buffer layer 12 is used for growing high-quality semiconductor layers and is formed on a surface of the substrate 11 by an MOCVD method. Although this embodiment shows the case where the buffer layer is made of AlN, the invention is not limited thereto. For example, a binary compound such as GaN or InN, a so-called ternary compound such as $Al_xGa_{1-x}N$, $Al_xIn_{1-x}N$ or $Ga_xIn_{1-x}N$ ($0<x<1$) or a Group III nitride compound semiconductor (quarternary compound) represented by $Al_aGa_bIn_{1-a-b}N$ ($0<a<1$, $0<b<1$, $a+b \leq 1$) may be used as the material of the buffer layer.

After the buffer layer 12 is formed, the first layer 13 is formed as a photo-excited semiconductor layer. The first layer 13 is a layer made of n-type GaN doped with Si and Se. The first layer is formed as follows. That is, an ammonia gas and TMG which is a Group III element alkyl compound gas are used as raw material gases. A silane gas and diethyl selenium are further used as a dopant supply source. The dope amounts of Si and Se are $1 \times 10^{18}/cm^3$ and $3 \times 10^{18}/cm^3$ respectively.

Then, the second layer 14, the third layer 15, the fourth layer 16, the fifth layer 17 and the sixth layer 18 are formed successively on the first layer 13. The structure of the fourth layer 16 may contain a multiple quantum well structure or a single quantum well structure.

A reflecting layer may be provided between the first layer 13 and the substrate 11 or on a surface of the substrate 11 where the semiconductor layers are not formed. When a reflecting layer is provided, light generated in the fourth layer 16 and moving toward the substrate 11 side and light generated in the first layer 13 and moving toward the substrate 11 side can be reflected by the reflecting layer so as to be move from the substrate 11 to electrodes 21 and 22. As a result, improvement in light-emitting efficiency can be attained when this direction is used as a light-extracting direction. The reflecting layer can be formed out of one member selected from the group consisting of: metal nitrides such as titanium nitride, zirconium nitride, tantalum nitride, and TiAlN; metals such as Al, In, Cu, Agl, Pt, Ir, Pd, Rh, W, Mo, Ti, and Ni; and alloys each composed of at least two metals optionally selected from the metals.

A layer of $Al_XGa_YIn_{1-X-Y}N$ ($0 \leq X \leq 1$, $0 \leq Y \leq 1$, $X+Y \leq 1$) doped with an acceptor such as magnesium and having a wide band gap may be interposed between the fourth layer 16 and the fifth layer 17. This arrangement is made for preventing electrons injected into the fourth layer 16 from diffusing into the fifth layer 17. The fifth layer 17 is made of p-type $Al_XGa_{1-X}N$ ($0<X<1$) doped with an acceptor such as magnesium. The fifth layer 17 may be made of p-type GaN or p-type $In_yGa_{1-y}N$ ($0<y<1$) instead.

Incidentally, the third and fifth layers maybe contained in the fourth layer 16 (including a light-emitting layer).

The n-electrode 22 is composed of two layers of Al and V. After the sixth layer 18 is formed, the sixth layer 18, the fifth layer 17, the fourth layer 16, the third layer 15 and the second layer 14 are partially removed by etching. Then, the n-electrode 22 is formed on the second layer 14 by vapor deposition.

The light-transmissive electrode 19 is a thin film containing gold and is formed in a wide range on the upper surface of the sixth layer 18. The p-electrode 21 is formed on the light-transmissive electrode 19 by vapor deposition. After these steps, the wafer is separated into chips.

Figure 2:
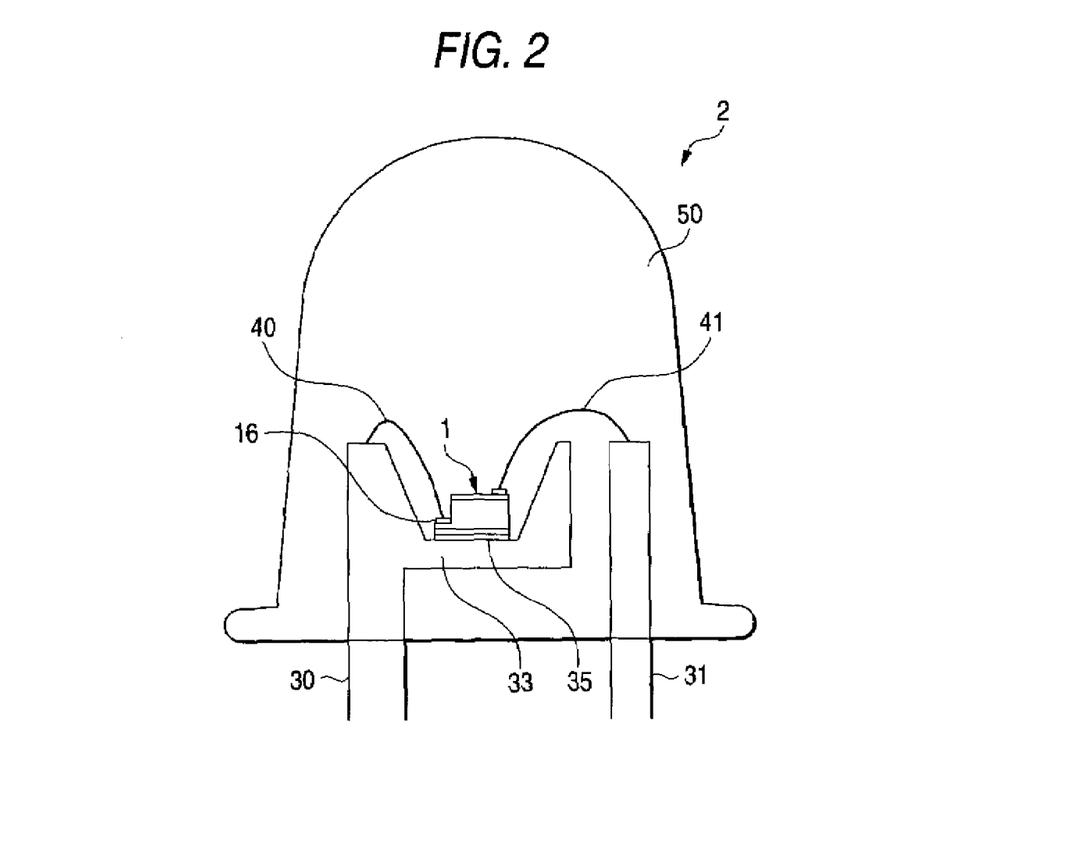
FIG. 2 is a view schematically showing the configuration of an LED using the light-emitting element according to this embodiment of the invention.

The light-emitting element 1 shown in FIG. 1 is used for forming an LED 2 shown in FIG. 2 as follows. First, the light-emitting element 1 is mounted, by an adhesive agent 35, into a cup portion 33 provided in a lead frame 30. The adhesive agent 35 is silver paste containing an epoxy resin, and silver as a filler mixed with the epoxy resin. When such silver paste is used, heat can be better radiated from the light-emitting element 1.

The p-electrode 21 and the n-electrode 22 in the light-emitting element 1 are wire-bonded to lead frames 31 and 30 by wires 41 and 40 respectively. Then, the light-emitting element 1, part of the lead frames 31 and 30 and the wires 40 and 41 are sealed with a sealing resin 50 made of an epoxy resin. The material of the sealing resin 50 is not particularly limited if the material is transparent. Besides the epoxy resin, a silicone resin, a urea resin or glass may be used preferably.

The sealing resin 50 is provided for protecting the device structure. When the shape of the sealing resin 50 is changed in accordance with the purpose, a lens effect can be given to the sealing resin 50. For example, the sealing resin 50 may be molded into a concave lens type or a convex lens type as well as the round type shown in FIG. 2. The shape of the sealing resin 50 viewed from the light-extracting direction (above in FIG. 2) may be also a circular shape, an elliptic shape or a rectangular shape.

The sealing resin 50 may contain a fluorescent substance which is excited by light emitted from the light-emitting element 1 (that is, by light generated in the fourth layer 16 or by light generated in the first layer 13 ) to thereby emit light. Alternatively, the cup portion 33 of the lead frame 30 may be filled with such a fluorescent substance-containing resin.

The sealing resin 50 may also contain a diffusing agent. When the diffusing agent is used, the directivity of light emitted from the light-emitting element 1 can be relaxed. Examples of the diffusing agent used include titanium oxide, titanium nitride, tantalum nitride, aluminum oxide, silicon oxide, and barium titanate.

Further, the sealing resin 50 may further contain a colorant. The colorant is used for preventing the fluorescent substance from exhibiting a peculiar color in a state that the light-emitting element 1 is switched on or off.

Incidentally, the sealing resin 50 may contain one kind of material as each of the fluorescent substance, the diffusing agent and the colorant or may contain at least two kinds of materials.

In the LED 2 configured as described above, first, blue light is emitted from the fourth layer 16. Upon reception of a part of the blue light from the fourth layer 16, the first layer 13 emits yellow light. As a result, the yellow light emitted from the first layer 13 and the other part of the blue light emitted from the fourth layer 16 which has not been used for light emission are mixed with each other in terms of the color of light, so that white light as a whole can be obtained.

Figure 3:
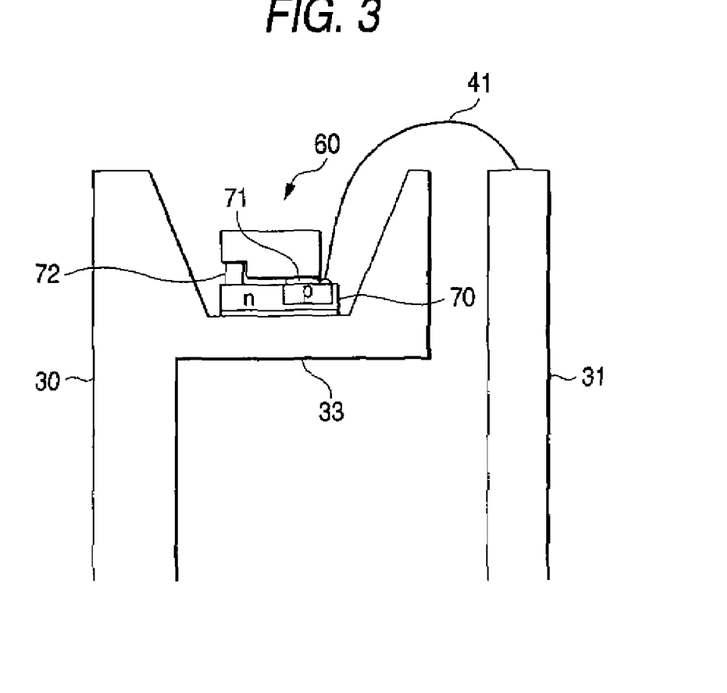
FIG. 3 is a partly enlarged view of an LED using a light-emitting element as a modified example of this embodiment.

In the LED 2, a surface of the substrate 11 in the light-emitting element 1 is used as an adhesive surface so that the light-emitting element 1 is mounted into the cup portion 33 of the lead frame 30. Alternatively, as shown in FIG. 3, the light-emitting element may be mounted so as to be shaped like a flip chip. FIG. 3 is an enlarged view of the cup portion 33 of the lead frame 30, showing an example in which an LED 3 is formed by using a planar type Zener light-emitting element 60. The light-emitting element 60 has a substrate 11, and semiconductor layers 13 to 18 formed on the substrate 11 in the same manner as in the light-emitting element 1. The light-emitting element 60 is fixed on a silicon substrate 70 so as to be shaped like a flip chip. The sixth layer 18 in the light-emitting element 60 is connected to the p-type region of the silicon substrate 70 through a metal electrode layer 71. The material of the metal electrode layer 71 is not particularly limited if the material brings ohmic contact between the silicon substrate 70 and the sixth layer 18. For example, a gold alloy can be used as the material of the metal electrode layer 71. The second layer 14 in the light-emitting element 60 is connected to the n-type region of the silicon substrate 70 through a metal electrode layer 72. The material of the metal electrode layer 72 is not particularly limited if the material brings ohmic contact can be obtained between the silicon substrate 70 and the second layer 14. For example, an aluminum alloy can be used as the material of the metal electrode layer 72. The p-type portion of the silicon substrate 70 is connected to the lead frame 31 through the wire 41.

Second Embodiment

Figure 4:
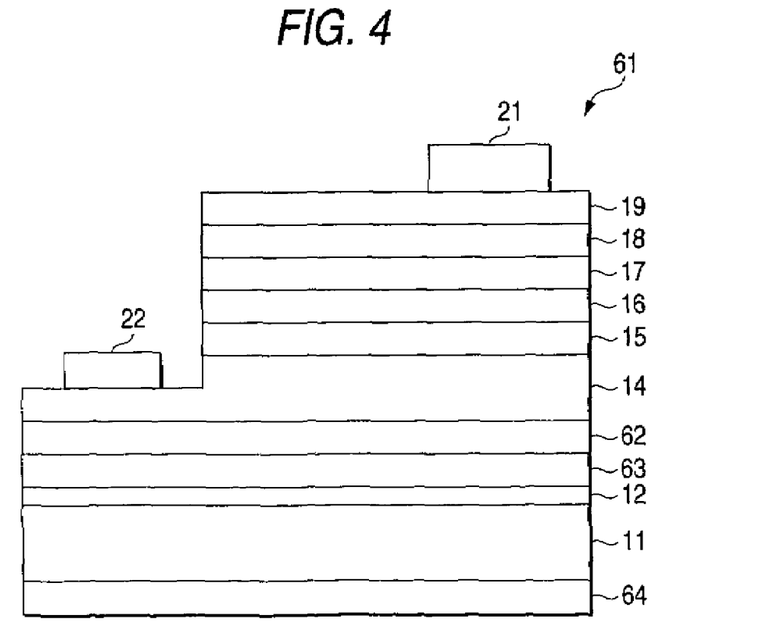
FIG. 4 is a view schematically showing the configuration of a light-emitting element as another embodiment of the invention.

FIG. 4 is a view schematically showing the configuration of a Group III nitride compound semiconductor light-emitting element 61 as a second embodiment of the invention. Incidentally, members the same as those in FIG. 1 are referenced correspondingly and the description of these members will be partially omitted. Specifications of respective layers in the light-emitting element 61 are as follows.

| Layer | Composition: Dopant (Thickness) |
|---|---|
| Sixth layer 18 | p-AlGaN: Mg (0.05 µm) |
| Fifth layer 17 | p-AlGaN: Mg (0.03 µm) |
| Fourth layer 16 | Including an InGaN layer |
| Third layer 15 | n-AlGaN: Si (0.2 µm) |
| Second layer 14 | n-GaN: Si (1.5 µm) |
| Seventh layer 62 | n-AlGaN: Ge (2 µm) |
| Eighth layer 63 | GaN (0.5 µm) |
| Buffer layer 12 | AlN (10 nm) |
| Substrate 11 | Sapphire (300 µm) |
| Ninth layer 64 | GaN: S, Eu (10 µm) |

First, the ninth layer 64 is formed on the rear surface of the substrate 11. The ninth layer 64 is a layer made of n-type GaN doped with S (sulfur) and Eu (europium). A fluorescent substance Eu (europium) compound DPM₃Eu (made by TRI CHEMICAL LABORATORY INC.) is used as a source for supplying a fluorescent substance. Diethyl sulfur is used as a source for supplying a dopant. $H_2$ as a carrier gas at a flow rate of about 500 sccm is supplied into a reactor in the condition that the temperature of DPM₃Eu as the fluorescent substance is set to be 30° C. Then, the substrate 11 is turned upside down and the following layers are formed on the front surface of the substrate 11.

After the buffer layer 12 is formed on the front surface of the substrate 11, the eighth layer 63 of GaN is formed. The eighth layer 63 is a non-doped semiconductor layer which is provided for improving the crystalline quality of the seventh layer 62 formed in succession to the eighth layer 63.

The seventh layer 62 is made of n-type AlGaN doped with Ge and is formed by using tetramethyl germanium as a source for supplying a dopant. The respective semiconductor layers 14 to 18 are formed successively on the seventh layer 62.

The quantum well layer constituting the fourth layer 16 is made of a quarternary compound AlGaInN. The fourth layer 16 has a portion containing a large amount of Al, and a portion containing a large amount of In. Hence, the fourth layer 16 emits light exhibiting two emission peaks in an ultraviolet region and a blue region.

The light-emitting element 61 configured as described above is mounted so as to be shaped like a flip chip in the same manner as in the configuration of the LED 3 shown in FIG. 3, to thereby form a light-emitting device. First, ultraviolet light and blue light are emitted from the fourth layer 16. The wavelength of the ultraviolet light is converted by the seventh layer 62 and the ninth layer 64, so that the ninth layer 64 emits red light and the seventh layer 62 emits green light. On this occasion, the blue light emitted from the fourth layer 16 is radiated out as it is. As a result, the blue light emitted from the fourth layer 16, the red light emitted from the ninth layer 64 and the green light emitted from the seventh layer 62 are mixed with one another in terms of the color of light, so that white emitted light is obtained as a whole. The emitted light obtained thus in this case exhibits emission peaks corresponding to the three primary colors of light, that is, blue, red and green. Hence, when the light-emitting element 61 is used for illumination or in a liquid-crystal backlight, there is an advantage in that good color reproducibility and excellent color rendering characteristic can be obtained.

Third Embodiment

Figure 5:
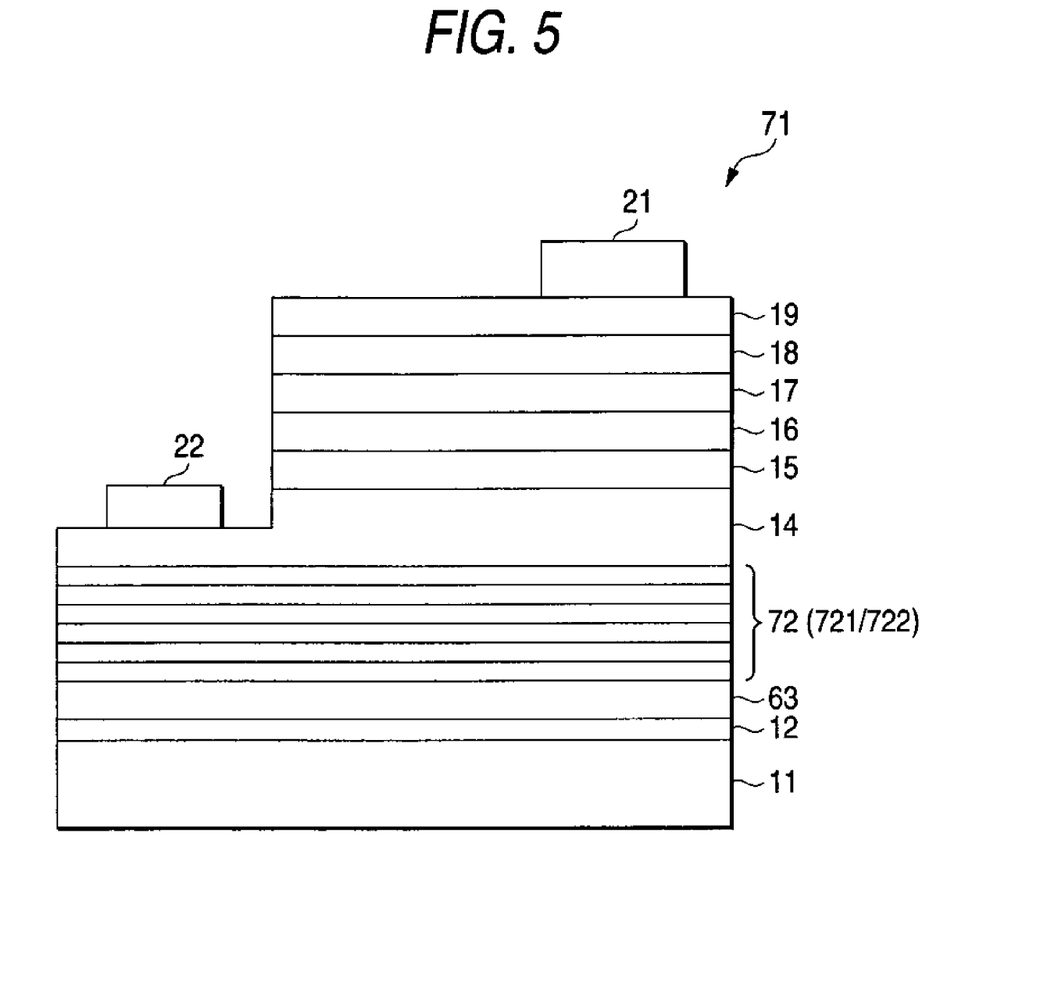
FIG. 5 is a view schematically showing the configuration of a light-emitting element as a further embodiment of the invention.

FIG. 5 is a view schematically showing the configuration of a Group III nitride compound semiconductor light-emitting element 71 as a third embodiment of the invention. The light-emitting element 71 is formed in the same manner as the light-emitting element 61 shown in FIG. 4, except that the ninth layer 64 as one photo-excited semiconductor layer is omitted and that the seventh layer 62 as the other photo-excited semiconductor layer is replaced by a layer 72 containing a photo-excited layer. Members the same as those in the light-emitting element 62 shown in FIG. 4 are referenced correspondingly, and the description of these members will be partially omitted. Specifications of respective layers in the light-emitting element 71 are as follows.

| Layer | Composition: Dopant (Thickness) |
|---|---|
| Sixth layer 18 | p-AlGaN: M (0.05 μm) |
| Fifth layer 17 | p-AlGaN: Mg (0.03 μm) |
| Fourth layer 16 | Including an InGaN layer |
| Third layer 15 | n-AlGaN: Si (0.2 μm) |
| Second layer 14 | n-GaN: Si (1.5 μm) |
| Photo-excited layer containing layer 72 | Layer including the following periodic structure |
| Second excited layer 722 | n-InGaN: Te (0.12 μm) |
| First excited layer 721 | n-AlGaN: Ge (0.12 μm) |
| Iteration number of first and second excited layers: 1 to 30 | |
| Eighth layer 63 | GaN (0.5 μm) |
| Buffer layer 12 | AlN (10 nm) |
| Substrate 11 | Sapphire (300 μm) |

In the light-emitting element 71, the photo-excited layer-containing layer 72 has a structure in which first excited layers 721 of n-type AlGaN doped with Ge and second excited layers 722 of n-type InGaN doped with Te are laminated alternately. The thickness of each layer is selected to be substantially equal to $\lambda/2n$ in which $\lambda$ is the peak emission wavelength (about 460 nm) of the light-emitting layer, and $n$ is the refractive index (about 2) of the excited layer. The wavelength of a part of the blue light emitted from the fourth layer 16 is converted by the first and second excited layers 721 and 722, so that the first and second excited layers 721 and 722 emit green light and yellow light respectively. Hence, these kinds of light are mixed with one another in terms of the color of light, so that white emitted light can be obtained as a whole. On this occasion, the light emitted from the fourth layer 16 is repeatedly reflected in the photo-excited layer-containing layer 72. Accordingly, the wavelength converting efficiency can be improved. At the same time, the light moving toward the substrate 11 side can be reflected to move toward the light-transmissive electrode 19. Hence, the light-extracting efficiency can be improved when this direction is used as a light-extracting direction. As a result, high-luminance emission can be obtained.

The invention is not limited at all to the description of the mode for carrying out the invention. The invention may be applied to a laminate which is an intermediate product of the light-emitting element. The invention includes various modifications that can be conceived easily by those skilled in the art, without departing from the description of the scope of claim.

What is claimed is:

1. A Group III nitride compound semiconductor light-emitting element comprising:
   a substrate;
   a light-emitting layer comprising a Group III nitride compound semiconductor; and
   at least one photo-excited semiconductor layer comprising a doped Group III nitride compound semiconductor that is excited by light emitted from said light-emitting layer to thereby emit light at a wavelength longer than that of said light emitted from said light-emitting layer,
   wherein a plurality of photo-excited semiconductor layers are provided as said at least one photo-excited semiconductor layer, said plurality of photo-excited semiconductor layers comprising at least one layer of n-type AlGaN and at least one layer of n-type InGaN.

2. A Group III nitride compound semiconductor light-emitting element according to claim 1, wherein said photo-excited semiconductor layer is doped with impurities.

3. A Group III nitride compound semiconductor light-emitting element according to claim 2, wherein said photo-excited semiconductor layer is doped with at least one of silicon, sulfur, selenium, tellurium, germanium, carbon, and oxygen.

4. A Group III nitride compound semiconductor light-emitting element according to claim 1, wherein band gap energy of said photo-excited semiconductor layer is smaller than that of said light-emitting layer.

5. A Group III nitride compound semiconductor light-emitting element comprising:
a substrate;
a light-emitting layer comprising a Group III nitride compound semiconductor; and
at least one photo-excited semiconductor layer comprising a doped Group III nitride compound semiconductor that is excited by light emitted from said light-emitting layer to thereby emit light at a wavelength longer than that of said light emitted from said light-emitting layer;
wherein said photo-excited semiconductor layer comprises $In_xAl_yGa_{1-x-y}N$ (0<x<1, 0<y<1, 0<x+y<1, y<x) doped with n-type impurities.

6. A Group III nitride compound semiconductor light-emitting element comprising:
a substrate;
a light-emitting layer comprising a Group III nitride compound semiconductor; and
at least one photo-excited semiconductor layer comprising a doped Group III nitride compound semiconductor that is excited by light emitted from said light-emitting layer to thereby emit light at a wavelength longer than that of said light emitted from said light-emitting layer,
wherein said photo-excited semiconductor layer comprises $In_aGa_{1-a}N$ (0<a<1) doped with n-type impurities.

7. A Group III nitride compound semiconductor light-emitting element according to claim 1, wherein said photo-excited semiconductor layer comprises at least one fluorescent substance.

8. A Group III nitride compound semiconductor light-emitting element according to claim 7, wherein said fluorescent substance comprises rare-earth elements.

9. A Group III nitride compound semiconductor light-emitting element according to claim 1, wherein said plurality of photo-excited semiconductor layers comprise a laminate of layers, said layers differing in composition.

10. A Group III nitride compound semiconductor light-emitting element according to claim 1, wherein said plurality of photo-excited semiconductor layers are excited by said light emitted from said light-emitting layer to thereby emit a plurality of wavelengths of light.

11. A Group III nitride compound semiconductor light-emitting element according to claim 1, wherein said light-emitting layer emits at least two wavelengths of light exhibiting different emission peaks.

12. A Group III nitride compound semiconductor light-emitting element according to claim 11, wherein said light-emitting layer emits said at least two wavelengths of light in a visible region and in an ultraviolet region, said ultraviolet light exhibiting a peak emission wavelength not longer than 400 nm.

13. A Group III nitride compound semiconductor light-emitting element according to claim 1, further comprising a layer comprising at least one fluorescent substance.

14. A Group III nitride compound semiconductor light-emitting element according to claim 1, wherein white light is radiated outwardly.

15. A Group III nitride compound semiconductor light-emitting element comprising:
a substrate;
a light-emitting layer comprising a Group III nitride compound semiconductor;
a doped Group III nitride compound semiconductor layer having band gap energy smaller than that of said light-emitting layer; and
a plurality of photo-excited semiconductor layers which comprise at least one layer of n-type AlGaN and at least one layer of n-type InGaN,
wherein said Group III nitride compound semiconductor layer is excited by light emitted front said light-emitting layer.

16. A Group III nitride compound semiconductor light-emitting element according to claim 1, wherein said light-emitting layer comprises:
a first portion comprising $Al_{x1}Ga_{1-x1-x2}In_{x2}N$ (0<1<1, 0<x2<1, x1>x2) and
a second portion comprising $Al_{y2}Ga_{1-y1-y2}In_{y1}N$ (0<y1<1, 0<y2<1, y1>y2),
wherein said first portion and said second portion emit light exhibiting emission peaks at different wavelengths.

17. A Group III nitride compound semiconductor light-emitting element according to claim 1, wherein said light-emitting layer comprises a plurality of light-emitting layers, said plurality of light-emitting layers comprising different band gap energies and emitting light exhibiting emission peaks at correspondingly different wavelengths.

18. A Group III nitride compound semiconductor light-emitting element according to claim 9, wherein said layers differing in composition are laminated alternately, such that a thickness of said photo-excited layer is substantially equal to $m\lambda/2n$, where m is a natural number, $\lambda$ is a peak emission wavelength of the lightemitting layer, and n is a refractive index of said photo-excited layer.

19. A method of making a Group III nitride compound semiconductor light-emitting element comprising:
forming a light-emitting layer, comprising a Group III nitride compound semiconductor, on a substrate; and
forming at least one photo-excited semiconductor layer above or below said substrate,
wherein said at least one photo-excited semiconductor layer comprises a doped Group III nitride compound semiconductor that is excited by light emitted from said light-emitting layer to thereby emit light at a wavelength longer than that of said light emitted from said light-emitting layer, and
wherein said forming at least one photo-excited semiconductor layer comprises forming a plurality of photo-excited semiconductor layers which comprise at least one layer of n-type AlGaN and at least one layer of n-type InGaN.

20. A group III nitride compound semiconductor light-emitting element according to claim 1, wherein said light-emitting layer emits at least a first light and a second light wherein said first light exhibits an emission peak at wavelength that is different from said second light.

21. A group III nitride compound semiconductor light-emitting element according to claim 2, wherein en amount of said impurities is selected to be in a range of $1\times10^{16}/cm^3$ to $5\times10^{21}/cm^3$.

22. A group III nitride compound semiconductor light-emitting element according to claim 1, wherein said photo-excited semiconductor layer has a band gap energy of from 1.9 eV to 3.4 eV.

23. A group III nitride compound semiconductor light-emitting element according to claim 7, wherein said fluorescent substance comprises at least one of lanthanum (La), cerium (Ce) praseodyium (Pr), neodymium (And), samarium (Sm), gadolinium (Gd), dysposium (Dy), erbium (Er), europium (Eu), terbium (Tb), holmium (Ho), thulium (Tm), ytterbium (Yb), and lutetium (Lu).

24. A group III nitride compound semiconductor light-emitting element according to claim 23, wherein said fluorescent substance comprises at least one of erbium (Er) and terbium (Tb).

25. A group III nitride compound semiconductor light-emitting element according to claim 1, further comprising:
a non-doped semiconductor layer disposed on a front surface of said substrate.

26. A group III nitride compound semiconductor light-emitting element according to claim 1, wherein each of said plurality of photo-excited layers has a thickness that is substantially equal to $\lambda/2n$, and
wherein $\lambda$ represents the peak emission wavelength of said light-emitting layer and n represents the refractive index of said photo-excited layers.

27. A group III nitride compound semiconductor light-emitting element according to claim 1, wherein said photo-excited layer is disposed between said light-emitting layer and said substrate.

28. A Group III nitride compound semiconductor light-emitting element according to claim 1, wherein said doped Group Ill nitride compound semiconductor is doped with at least one of silicon, selenium, germanium and tellurium.

29. A Group III nitride compound semiconductor light-emitting element according to claim 15, wherein said doped Group III nitride compound semiconductor is doped with at least one of silicon, selenium, germanium and tellurium.

30. A method of making a Group III nitride compound semiconductor light-emitting element according to claim 19, wherein said doped Group III nitride compound semiconductor is doped with at least one of silicon, selenium, germanium and tellurium.

31. A Group III nitride compound semiconductor light-emitting element according to claim 1, wherein the photo-excited layer is formed on a side which is closer to the substrate than the light-emitting layer.

32. A Group III nitride compound semiconductor light-emitting element according to claim 15, wherein the photo-excited layer is formed on a side which is closer to the substrate than the light-emitting layer.

33. A method of making a Group III nitride compound semiconductor light-emitting element according to claim 19, wherein the photo-excited layer is formed on a side which is closer to the substrate than the light-emitting layer.

* * * * *